United States Patent [19]  [11] 3,989,475
Howe                                [45] Nov. 2, 1976

[54] COMPOSITE SUPERCONDUCTORS

[75] Inventor: David G. Howe, Greenbelt, Md.

[73] Assignee: The United States of America as represented by the Secretary of the Navy, Washington, D.C.

[22] Filed: May 30, 1975

[21] Appl. No.: 582,503

[52] U.S. Cl. .................................. 29/194; 29/198
[51] Int. Cl.² ...................................... B32B 15/00
[58] Field of Search ...................... 29/194, 198, 599

[56] References Cited
UNITED STATES PATENTS

| | | |
|---|---|---|
| 3,397,084 | 8/1968 | Krieglstein .................... 29/194 X |
| 3,443,304 | 5/1969 | Maier ............................ 29/194 X |
| 3,534,459 | 10/1970 | Kudo et al. ..................... 29/194 |
| 3,574,573 | 4/1971 | Tachikawa et al. ................ 29/198 |
| 3,728,165 | 4/1973 | Howlett ......................... 29/194 X |
| 3,731,374 | 5/1973 | Suenaga ......................... 29/198 X |

Primary Examiner—L. Dewayne Rutledge
Assistant Examiner—E. L. Weise
Attorney, Agent, or Firm—R. S. Sciascia; Philip Schneider; Thomas McDonnell

[57] ABSTRACT

A composite superconductor which comprises (1) a first layer of an alloy selected from the group consisting of a vanadium-gallium (V—Ga) alloy with a gallium content from 12.5 at. % to 17.5 at. %, a niobium-tin alloy (Nb-Sn) with a tin content from 12 at. % to 17.5 at. %, and a vanadium-silicon (V—Si) alloy with a silicon content from 10.0 at. % to 20.0 at. %; (2) an intermediate layer of an A-15 compound selected from the group consisting of $V_3Ga$, $Nb_3Sn$, and $V_3Si$; (3) a third layer of an alloy selected from the group consisting of copper-gallium (Cu—Ga) alloy with a gallium content greater than 22 at. % but not greater than 30.0 at. %, a copper-tin (Cu-Sn) alloy with a tin content greater than 11 at. % but not greater than 21.0 at. %, and a copper-silicon (Cu—Si) alloy with a silicon content greater than 14 at. % but not greater than 21 at. %.

2 Claims, No Drawings

COMPOSITE SUPERCONDUCTORS

BACKGROUND OF THE INVENTION

This invention relates generally to superconductors and in particular to superconductors made from a solid state reaction between two two-phase alloys.

Intermetallic compounds having an A-15 crystal structure are known to be exceptional superconducting materials. This structure is also referred to as a beta-tungsten crystalline structure. One of the ways in which these compounds are obtained is by a solid state reaction between two alloys in a vacuum or inert atmosphere at an elevated temperature.

The rate of growth of the intermetallic layer is important. The obvious advantage is the economy of reducing the amount of time which metals are maintained at an elevated temperature. Other advantages come from the changes in the physical properties of the intermetallic metal produced by a faster solid state reaction. As the growth rate increases the grain size decreases which improves flux pinning.

The major difficulty associated with manufacturing superconductors with A-15 compounds is fabricating them into usable configurations. First of all the A-15 compounds are extremely brittle and some of the alloys also become brittle through work hardening. Another problem is the adverse effect impurities may have on the completed composite superconductor. Tightness of the bond between the two alloys producing the A-15 compound and grain size of the resulting A-15 compound are also important considerations.

If the solid solution limit of a metal solute in a metal solvent is exceeded, a two phase phenomena is produced in the alloy. The second phase sometimes appears as a precipitation at the grain boundaries of the alloy. In fact, as the concentration of the solute approaches the solid solution limit, discrete particles may begin to faintly form at the grain boundaries.

The second phase precipitation at the grain boundaries can provide crack starters and as a result intergranular fractures occur during processing. On account of the two phase phenomena it was thought that the alloys selected could not exceed the solid solution limit of the solute metal in the solvent metal and that the optimum results would be achieved at a solute concentration of around 2/3 of the solid solution limit.

In patent application Ser. No. 527,000 by Howe, filed Nov. 25, 1974, now U.S. Pat. No. 3,926,684, dated Dec. 16, 1975, it was disclosed that alloys slightly over the solid solution limit of the solute metal could be processed and that the resulting superconductors possessed extraordinary properties. However alloys with a decided two phase structure were not disclosed as useful in fabricating superconductors. It was thought that such alloys would have too much of the A-15 crystal structure to be processable and to provide a high quality product.

OBJECTS OF THE INVENTION

It is therefore an object of the invention to provide superconductors prepared from two phase alloys.

Another object is to prepare superconductors from a solid state reaction with significantly shorter reaction times.

And another object is to prepare superconductors with reduced grain size.

These and other objects are achieved by preparing composite superconductors by a solid state reaction from two layers of two phase alloys which are tightly bonded together.

DETAILED DESCRIPTION OF THE INVENTION

The alloys used in fabricating the superconductors of this invention are:

1. a vanadium-gallium (V—Ga) alloy with a gallium content from 12.5 at. % to 18 at. % but preferably from 12.5 at. % to 14.0 at. %;
2. a niobium-tin (Nb—Sn) alloy with a tin content from 12 at. % to 17.5 at. %, but preferably from 12 at. % to 13 at. %;
3. a vanadium-silicon (V—Si) alloy with a silicon content from 10 at. % to 20 at. %, but preferably from 10 at. % to 12 at. %;
4. a copper-gallium (Cu—Ga) alloy with a gallium content from greater than 22 at. % to 30 at. %, but preferably from greater than 22.0 at. % to 23.5 at. %;
5. a copper-tin (Cu—Sn) alloy with a tin content from greater than 11 at. % to 21 at. %, but preferably from greater than 11 at. % to 13 at. %;
6. a copper-silicon (Cu—Si) alloy with a silicon content from greater than 14 at. % to 21 at. %, but preferably from greater than 14 at. % to 16 at. %.

The composite superconductors of the invention are composites of the aforedescribed alloys and the A-15 metals produced by a solid state reaction between pairs of the aforedescribed alloys. These composites are: (1) (V—Ga)—($V_3$Ga)—(Cu—Ga); (2) (Nb—Sn)—($Nb_3$Sn)—(Cu—Sn); and (3) (V—Si)—($V_3$Si)—(Cu—Si).

Although the size of the intermetallic layer may be any thickness, thinness is desirable because of the improved critical current density. The preferred thickness is from 0.5 to 3.0 microns. The dimensions for the two outer layers depend on the intended use, but generally would be from 2.5 to 300 microns.

The superconductors of this invention are prepared by tightly affixing two alloys together in the desired shape, e.g., composite. The intermetallic A-15 layer is formed at the interface by a solid state reaction which may proceed at a temperature as low as 450° C. Due to the undesired grain coarsening in the A-15 compound, the temperature should not exceed 800° C.

The general nature of the invention having been set forth, the following example is presented as a specific illustration of the practice thereof. It is understood that the invention is not limited to the example but is susceptible to different modifications that would be recognized by one of ordinary skill in the art.

EXAMPLE I

Preparation of a V-12.5 at. % Ga-$V_3$Ga-Cu-22.5 at. % Ga Superconductor.

Disc sections of a V-12.5 at. % Ga rod and a Cu-22.5 at. % Ga rod are first washed with methyl ethyl ketone and then washed with ethanol. The discs are acid etched with a solution which comprises 10 parts $HNO_3$, 2 parts HF, and 10 parts $H_2O$. The composite disc is assembled in an extremely clean area, in order to prevent the inclusion of any impurities between the two discs which form the composite disc.

The two discs are fusion bonded together by means of a vacuum hot press. The composite disc is fixed in place between the jaws of the press. The press is exhausted to a vacuum of $1 \times 10^{-5}$ Torr and heated to a temperature of 600° C. Pressure is applied to the disc in such an amount that the Cu—Ga alloy yields. This phenomena is detected by the pressure gage on the hydraulic line to the press suddenly dropping 30 to 50%. The discs are held under this pressure for one minute. Thereafter the pressure on the disc is released and the vacuum in the chamber of the press is also released. Heating is stopped and the entire apparatus along with the disc is allowed to cool to room temperature (25° C) which takes approximately 1 hour. After cooling to 25° C, the diffusion couple is removed from the press and sectioned into pie-shape specimens. The specimens are encapsulated in silica ampoules and reated isothermally at 450° C for 6 hours, thereby producing a composite superconductor.

The above technique shows considerable promise as the technique to be used in the manufacture of solid state switches. Sheets of two of aforedescribed alloys ae fusion bonded together. The desired shape is stamped out and the piece is then heated at the necessary temperature to affect the growth of the A-15 intermetallic layer between the two alloys.

Obviously many modifications and variations of the present invention are possible in light of the above teachings. It is therefore to be understood that, within the scope of the appended claims, the invention may be practiced otherwise than as specifically described.

What is claimed and desired to be secured by Letters Patent of the United States is:

1. A composite superconductor which comprises:
    a first outer layer of an alloy selected from the group consisting of vanadium-gallium (V—Ga) with a gallium content from 12.5 at. % to 17.5 at. %, niobium-tin (Nb—Sn) with a tin content from 12 at. % to 17.5 at. %, and a vanadium-silicon (V-Si) with a silicon content from 10.0 at. % to 20 at. %;
    a second outer layer of an alloy selected from the group consisting of copper-gallium (Cu—Ga) alloy with a gallium content of 22 at. % < Ga ≤ 30.0 at. %, a copper-tin (Cu—Sn) alloy with 11 at. % < Sn ≤ 21.0 at. %, and a copper-silicon (Cu-Si) alloy with 14 at. % < Si ≤ 21 at. % so that said second alloy has the same metal solute as said first alloy; and
    an intermediate layer of an A-15 intermetallic compound which is produced by a solid state reaction between said outer layers of alloys.

2. The composite superconductor of claim 1 wherein said first outer layer of alloy is selected from the group consisting of vanadium-gallium (V—Ga) alloy with 12.5 at. % ≤ Ga ≤ 14 at. %, a niobium-tin (Nb—Sn) alloy with 12.5 at. % ≤ Sn ≤ 13 at. %, and a vanadium-silicon (V—Si) alloy with 10 at. % ≤ Si ≤ 12 at. %; and said second outer layer of a copper-gallium (Cu—Ga) alloy with 22.0 < Ga ≤ 23.5, a copper-tin (Cu—Sn) alloy with 11 at. % < Sn ≤ 13 at. %, and a copper-silicon (Cu—Si) alloy with 14 at. % < Si ≤ 16 at. %.

* * * * *